United States Patent [19]

Saito et al.

[11] 4,374,377

[45] Feb. 15, 1983

[54] PIEZOELECTRIC AUDIO TRANSDUCER

[75] Inventors: Nobuyuki Saito; Hiroshi Saito, both of Itami, Japan

[73] Assignee: Sumitomo Electric Industries, Ltd., Osaka, Japan

[21] Appl. No.: 215,037

[22] Filed: Dec. 10, 1980

[30] Foreign Application Priority Data

Dec. 12, 1979 [JP] Japan .......................... 54-171999[U]
Dec. 13, 1979 [JP] Japan .......................... 54-172588

[51] Int. Cl.³ .......................... G08B 3/00; H01L 41/10

[52] U.S. Cl. .......................... 340/384 E; 310/324; 310/345; 310/348

[58] Field of Search .............. 340/384 E, 384 R, 566; 310/322, 324, 345, 348; 179/110 A, 110 B, 110 C, 110 D, 110 E, 110 F, 110 R

[56] References Cited

U.S. PATENT DOCUMENTS

| | | | |
|---|---|---|---|
| 3,733,804 | 5/1973 | Diersbock | 340/384 E X |
| 4,047,060 | 9/1977 | Schafft | 310/345 X |
| 4,219,756 | 8/1980 | Nishida et al. | 310/348 |
| 4,278,851 | 7/1981 | Takaya | 340/384 E X |

*Primary Examiner*—John W. Caldwell, Sr.
*Assistant Examiner*—Daniel Myer
*Attorney, Agent, or Firm*—Wenderoth, Lind & Ponack

[57] ABSTRACT

A piezoelectric audio transducer adapted to produce a sound output when a vibrator which is formed by bonding a piezoelectric element to a metallic diaphragm is electrified, wherein the audio transducer is formed by securely supporting the outer periphery of the vibrator on an acoustic casing, and a fixing part to be fixed to a mounting body is provided on the audio transducer and is connected to the casing with an elastic body interposed therebetween so as to thereby enable the casing which is fixed to the mounting body to vibrate integrally with the vibrator when said vibrator is vibrated.

5 Claims, 13 Drawing Figures

PIEZOELECTRIC AUDIO TRANSDUCER

BACKGROUND OF THE INVENTION

The invention relates to a piezoelectric audio transducer comprising a piezoelectric vibrator which is formed by bonding a piezoelectric ceramic element to a metallic diaphragm; the vibrator is supported by a casing having an acoustic effect and the like.

The piezoelectric buzzer has an advantage in that it is not only small-sized, thin, light in weight, power saving and durable but is also capable of producing a variety of tones in combination with various drive circuits. Thus, the piezoelectric buzzer has come to replace the conventional electromagnetic buzzer as an alarm in various fields.

The piezoelectric buzzer comprises two types: an audio transducer in which a two-terminal vibrator is used, as shown in FIGS. 1 and 2, and an audio transducer in which a three-terminal vibrator is used, as shown in FIGS. 3 and 4. With both types, the wider the range of their use becomes, the greater is the demand for a better sound, that is, for a lower frequency.

In order to meet the demand for a lower frequency and to simply the supporting method, the casing supporting the outer periphery of the diaphragm was conventionally secured to the mounting body by means of screws or the like, as shown in FIGS. 5 and 6.

In the case of this supporting system in which the outer periphery of the diaphragm is completely secured to the mounting body, the casing supporting the diaphragm is completely independent of the vibration, of the vibrator whereby it is difficult to get the vibrator to vibrate.

Compared with the audio transducer comprising a two-terminal vibrator, the audio transducer in which a three-terminal vibrator is used creates many problems to be solved.

Theoretically, the audio transducer comprising a three-terminal vibrator has an advantage in that the cost of the drive circuits is drastically reduced since the feedback electrode enables the simplification of the drive circuits by using a self-excited vibration system. Conventionally, however, said system has been considered to be practically impossible in the case of the construction in which the diaphragm is securely supported by its outer periphery when connected to the self-excited vibration circuit.

The reason why stable vibration is not obtainable may be attributable to an insufficient amount of feedback signal.

The self-excited vibration circuit requires a feedback signal which is sufficiently large to switch a drive transistor on and off.

To be more precise, when the outer periphery of the diaphragm is securely supported, the resonant impedance of the audio transducer is far smaller than that when the node of free vibration is supported.

Thus, the three-terminal audio transducer in which the node of free vibration is supported vibrates with stability, whereas the three-terminal audio transducer in which the outer periphery of the diaphragm is supported vibrates with less stability.

SUMMARY OF THE INVENTION

The invention proposes a method for eliminating the aforementioned difficulties. It has for a first object to provide a three-terminal piezoelectric audio transducer capable of vibrating with stability by so adapting the transducer such that the vibrator and the casing supporting it are integrally vibrated.

The invention has for a second object to provide a three-terminal piezoelectric audio transducer in which the feedback signal is of the same value as when the node of free vibration is supported so that self-excited vibration is made possible, thereby enabling a drastic reduction in the cost of the drive circuits.

The invention has for a third object to provide a piezoelectric audio transducer which can be fixed to a mounting body with ease and simplicity.

These and other objects are accomplished by the parts, improvements, combinations and arrangements comprising the invention, preferred embodiments of which are shown by way of example in the accompanying drawings and herein described in detail.

DESCRIPTION OF THE PREFERRED EMBODIMENTS

Figure 1:
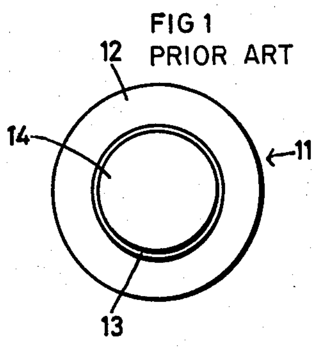
FIG 1 PRIOR ART
FIG. 1 is a surface view of a two-terminal vibrator.
Figure 3:
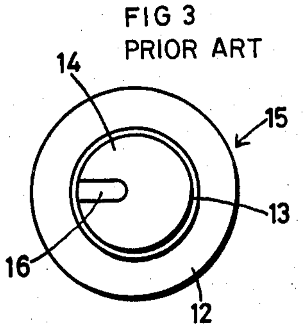
FIG 3 PRIOR ART
FIG. 3 is a surface view of a three-terminal vibrator.
Figure 2:
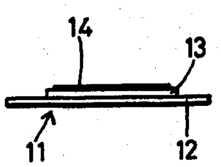
FIG 2 PRIOR ART
FIG. 2 is a side view of the same.
Figure 4:
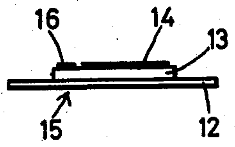
FIG 4 PRIOR ART
FIG. 4 is a side view of the same.

As shown in FIGS. 1 and 2, the two-terminal vibrator 11 comprises a piezoelectric element 13 bonded on the surface of a metallic diaphragm 12 and having a main electrode 14 of the element provided on the surface thereof; the three-terminal vibrator 15, as shown in FIGS. 3 and 4, comprises a piezoelectric element 13 bonded on the surface of a metallic diaphragm 12, and having a main electrode 14 and a feedback electrode 16 provided on the surface of the piezoelectric element 13.

Figure 5:
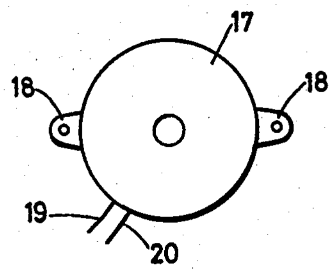
FIG 5 PRIOR ART
FIG. 5 is a surface view of a conventional two-terminal audio transducer in which the outer periphery of the diaphragm is securely supported.
Figure 6:
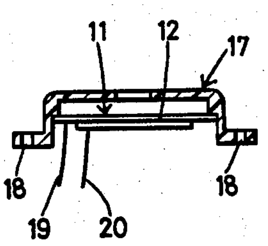
FIG 6 PRIOR ART
FIG. 6 is a longitudinal sectional side view of FIG. 5.

According to the conventional method of mounting the two-terminal vibrator 11, as shown in FIGS. 5 and 6, the outer periphery of the vibrator 11 was mounted on the casing 17 by adhesion or such other means, and the casing 17 was secured to the mounting body by clamping a fixing part 18 integrally provided on the casing 17 by means of a bolt and a nut.

Figure 7:
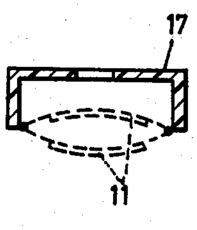
FIG 7 PRIOR ART
FIG. 7 is a diagram illustrating the vibration of the audio transducer of FIG. 5.

If the vibrator 11 is vibrated by the signals from the outside through lead wires 19; 20 connected to the main electrode 14 and the diaphragm 15, the vibration thus obtained will be as shown in FIG. 7.

When such fixing system is adopted, the vibration is limited to the inside of the node in case of three-terminal audio transducer, the feedback signal becoming excessively small so as to thereby make it impossible to obtain the self-excited vibration.

Now, the first embodiment of the invention, as shown in FIGS. 8 to 11, will be described in detail hereinunder.

In the first embodiment, a three-terminal vibrator 15 is used, the whole of the outer periphery thereof being secured to a casing 21 made of plastic material, lead wires 22, 22′, and 22″ being respectively connected to the metallic diaphragm 12, the main electrode 14 of the element and the feedback electrode 16.

A fixing part 23 and the casing are connected by an elastic part 24 to the mounting body. The elastic part 24 is a part of the plastic casing 21 and is formed into a thin plate.

Figure 10:
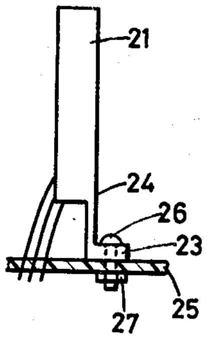
FIG. 10 is a side view showing how the audio transducer of FIG. 8 is mounted.

Thus, the casing is elastically supported by the elastic part 24, whereby the casing is vibrated integrally with the vibrator 15 when vibrated. FIG. 10 shows an example in which the audio transducer is mounted on a printed circuit board 25 which is the mounting body, the fixing part 23 being secured to the printed circuit board 25 by a bolt 26 and a nut 27.

Figure 11:
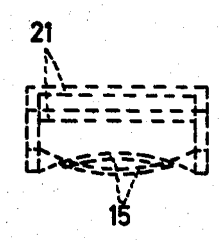
FIG. 11 is a diagram illustrating the vibration of the audio transducer of FIG. 8.
Figure 8:
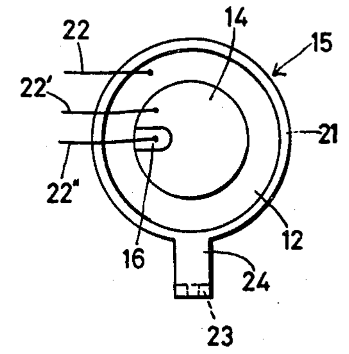
FIG. 8 is an elevational view of a three-terminal audio transducer which is a first embodiment of the invention.
Figure 9:
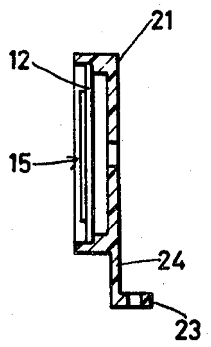
FIG. 9 is a longitudinal sectional side view of FIG. 8.

Though the three-terminal audio transducer is secured to the printed circuit board 25 by the fixing part 23, the casing 21 located above is capable of vibrating relatively freely in the direction normal to the surface of the vibrator since the elastic part 24 acts as a bumper. As shown in FIG. 11, when an input voltage is applied, the vibration system is capable of exhibiting a well-balanced vibration as a whole, and due to the elasticity of the elastic part 24, the supported outer periphery also vibrates synchronously.

For example, the resonant impedance in the case of the conventional fixed casing (FIGS. 5 and 6) and that of the first embodiment of the invention are respectively 5000 ohms and 4000 ohms, and the corresponding feedback voltages are respectively 0.5 volts and 6 volts relative to an input voltage of 1 volt and a feedback electrode load of 1 megohm.

Thus, the resonant impedance is lowered when the casing is adapted to vibrate in a well balanced fashion due to the elastic part 24. Since a sufficient feedback voltage is now obtainable, stabilized self-excited vibration is obtainable in the case of a three-terminal audio transducer having its outer periphery securely supported.

Figure 12:
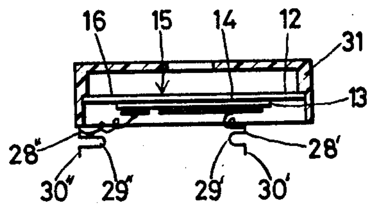
FIG. 12 is a longitudinal sectional elevation showing a second embodiment of the invention.
Figure 13:
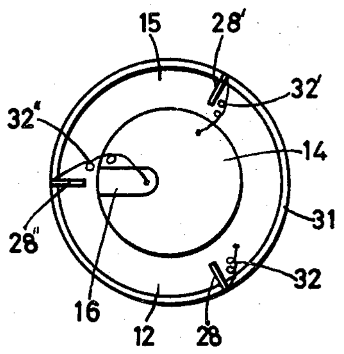
FIG. 13 is a bottom view of FIG. 12.

Next, the second embodiment will hereinunder be described in detail with reference to FIGS. 12 and 13.

The second embodiment is an example in which the elastic part connecting the fixing part and the casing is formed by pin terminals.

The pin terminals 28, 28′, and 28″ are made of an electroconductive metal wire and are provided with curved parts 29, 29′, and 29″ and insertion ends 30, 30′, and 30″ to be inserted into the printed circuit board. The pin terminals are fixed to the casing and are respectively connected to the vibrator electrode by lead wires 32, 32′, and 32″.

The insertion ends 30, 30′, and 30″ of the audio transducer of the second embodiment are welded to the printed circuit board and the curved parts 29, 29′, and 29″ act as elastic parts. When an input voltage is provided through the pin terminals, the vibrator 15 and the plastic material casing 31 and the pin terminals 28, 28′, and 28″ operate in a well balanced fashion due to the elasticity of the three pin terminals.

The impedance of the audio transducer having pin terminals fixed thereto is of a low value, and is substantially the same as in the case in which the node of free vibration is supported. Since a sufficient feedback signal is obtainable when a three-terminal vibrator is used, it is possible to obtain a stable self-excited vibration.

In the second embodiment, the pin terminal may be integrated with the lead wire, and the terminal is not restricted to a pin terminal but can be selected from among such electroconductive materials as will have elasticity even when the end thereof is secured to the printed circuit board. Furthermore, in the first embodiment, any other construction is acceptable if it permits the vibrator and the casing to vibrate in a well balanced fashion as an integral assembly with the elastic part, the casing not being completely secured to the mounting body.

According to the present invention, as described hereinabove, the casing supporting the outer periphery of the vibrator is mounted on the mounting body with the interposition therebetween of an elastic part having elasticity, thereby enabling the vibrator and the supporting casing and the elastic body to vibrate in a well balanced fashion as an integral assembly. The invention therefore enables the attainment of a very stabilized vibration.

In addition, a sufficient feedback signal can be fed back to the self-excited vibration circuit when a three-terminal vibrator is used. Inasmuch as a stabilized vibration is thus obtainable, the vibration circuit can be greatly simplified, thereby enabling the drastic reduction of the cost of the circuits and thereby enabling a sufficient sound output with a low resonant impedance.

Furthermore, if terminals which are both electroconductive and elastic are used for both mechanically supporting the assembly and for supplying electrical power, the housing can be mounted on the printed circuit board with simplicity, the problem of quality related to mounting also being eliminated.

What is claimed is:

1. A three-terminal audio transducer, wherein the outer periphery of a vibrator, which comprises a piezoelectric element placed on a metallic diaphragm, is securely supported on an acoustic casing, and wherein an elastic part is arranged between said casing and a fixing part of said audio transducer so as to be fixed to a mounting body, and wherein said elastic part has sufficient elasticity to enable said vibrator and casing and elastic part to vibrate in a well balanced fashion.

2. A three-terminal audio transducer as defined in claim 1, wherein said elastic part comprises a thin elastic plate which is integral with said casing and wherein said casing comprises a plastic material.

3. A three-terminal aduio transducer as defined in claim 1, wherein said elastic part comprises a plurality of electroconductive terminals for fixing said audio transducer to said mounting body.

4. A three-terminal audio transducer as defined in claim 3, wherein said plurality of electroconductive terminals comprise three electroconductive terminals which are fixed to said casing, two of said three electroconductive terminals being used for both supplying electrical power to said transducer and for mechanical support and the third of said three electroconductive terminals being used for both electrical feedback and mechanical support.

5. A three-terminal audio transducer as defined in claim 1, wherein said elastic part comprises three electroconductive terminals which are fixed to said casing, two of said three electroconductive terminals being used for both supplying electrical power to said transducer and for mechanical support and the third of said three electroconductive terminals being used for both electrical feedback and mechanical support.

* * * * *